(12) United States Patent
Dreesen et al.

(10) Patent No.: US 7,724,578 B2
(45) Date of Patent: May 25, 2010

(54) SENSING DEVICE FOR FLOATING BODY CELL MEMORY AND METHOD THEREOF

(75) Inventors: Michael A. Dreesen, Windsor, CO (US); John J. Wuu, Fort Collins, CO (US); Donald R. Weiss, Fort Collins, CO (US)

(73) Assignee: GlobalFoundries Inc.

( * ) Notice: Subject to any disclaimer, the term of this patent is extended or adjusted under 35 U.S.C. 154(b) by 534 days.

(21) Appl. No.: 11/639,865

(22) Filed: Dec. 15, 2006

(65) Prior Publication Data
US 2008/0144367 A1    Jun. 19, 2008

(51) Int. Cl.
*G11C 16/06* (2006.01)

(52) U.S. Cl. .............................. 365/185.21; 365/185.2; 365/196

(58) Field of Classification Search ............ 365/185.23, 365/185.17, 196, 185.21, 185.2, 192
See application file for complete search history.

(56) References Cited

U.S. PATENT DOCUMENTS

| | | | |
|---|---|---|---|
| 5,982,662 A * | 11/1999 | Kobayashi et al. | 365/185.03 |
| 6,269,040 B1 * | 7/2001 | Reohr et al. | 365/210.1 |
| 6,925,006 B2 | 8/2005 | Fazan et al. | |
| 6,930,918 B2 | 8/2005 | Fazan et al. | |
| 6,934,186 B2 | 8/2005 | Fazan et al. | |
| 6,937,516 B2 | 8/2005 | Fazan et al. | |
| 6,980,461 B2 | 12/2005 | Portmann et al. | |
| 7,061,050 B2 | 6/2006 | Fazan et al. | |
| 7,085,153 B2 | 8/2006 | Ferrant et al. | |
| 7,085,156 B2 | 8/2006 | Ferrant et al. | |
| 2001/0003508 A1 * | 6/2001 | Lee | 365/185.02 |
| 2003/0095453 A1 | 5/2003 | La Rosa | |
| 2003/0214861 A1 * | 11/2003 | Takano et al. | 365/200 |
| 2005/0141306 A1 * | 6/2005 | Hatakeyama et al. | 365/203 |
| 2006/0050584 A1 | 3/2006 | Gogl et al. | |
| 2006/0126374 A1 | 6/2006 | Waller et al. | |

OTHER PUBLICATIONS

PCT International Search Report, mailed Jun. 3, 2008, 3 pages.

* cited by examiner

*Primary Examiner*—Vu A Le
*Assistant Examiner*—Han Yang

(57) ABSTRACT

A memory device includes a memory array and a sense amplifier. The memory array includes a floating body cell configured to store a bit value. The sense amplifier includes a bit output configured to provide an output voltage representative of the bit value and a reference source configured to provide a reference voltage. The sense amplifier further includes a current mirror configured to provide a current to the first floating body cell based on the reference voltage, and a differential amplifier circuit configured to determine the output voltage based on the reference voltage and a voltage across the floating body cell resulting from application of the current to the floating body cell.

16 Claims, 3 Drawing Sheets

SENSING DEVICE FOR FLOATING BODY CELL MEMORY AND METHOD THEREOF

FIELD OF THE DISCLOSURE

The present disclosure relates generally to memory devices and more particularly to sensing devices for floating body cell memory devices.

BACKGROUND

Floating body cell (FBC) memory (also known as zero-capacitor random access memory or Z-RAM™) offers a compromise between the speeds achieved by static random access memory (SRAM) and the densities achieved by dynamic random access memory (DRAM). FBCs typically implement one or more transistors implemented on a silicon on insulator (SOI) substrate. By making use of the floating body effect caused by the transistor operating on the SOI substrate, the transistor can be configured to store a charge similar to a capacitor, whereby the amount of charge stored at the transistor then can be sensed to determine the bit value stored by the transistor.

Due to its physical characteristics, a FBC typically is incapable of sourcing a relatively large current. Sense amplifiers used to sense the stored values of FBC memory cells thus are configured to be sensitive to relatively small differences in the output of the FBC. However, conventional sense amplifiers for FBC memories typically have delayed response times and are intolerant of transistor mismatch within the sensing circuitry. Accordingly, an improved technique for sensing stored bit values in a FBC memory would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
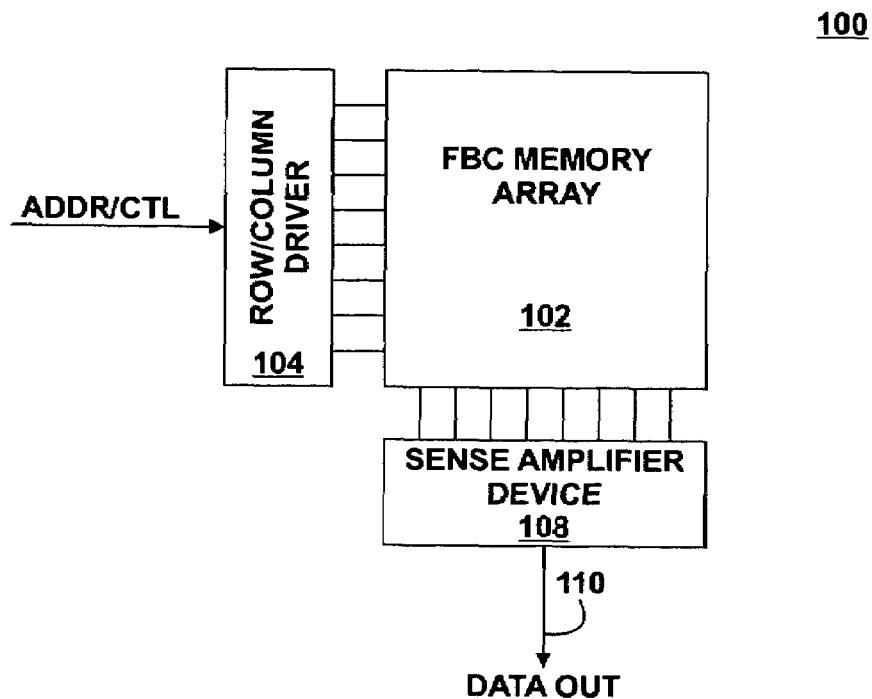
FIG. 1 is a diagram illustrating an example floating body cell (FBC) memory device in accordance with at least one embodiment of the present disclosure.

In accordance with one aspect of the present disclosure, a memory device includes a memory array and a sense amplifier. The memory array includes a floating body cell configured to store a bit value. The sense amplifier includes a bit output configured to provide an output voltage representative of the bit value, a reference source configured to provide a reference voltage, a current mirror configured to provide a current to the floating body cell based on the reference voltage, and a differential amplifier circuit configured to determine the output voltage based on the reference voltage and a voltage across the floating body cell resulting from application of the current to the floating body cell.

In accordance with another aspect of the present disclosure, a sense amplifier includes an input coupleable to a floating body cell of a memory array, the floating body cell configured to store a bit value and a bit output to provide an output voltage representative of the bit value. The sense amplifier further includes a first transistor, a second transistor, a third transistor, a fourth transistor, a fifth transistor, and a sixth transistor. The first transistor includes a first current electrode coupled to a first voltage reference, a second current electrode configured to receive a reference voltage, and a control electrode coupled to the second current electrode. The second transistor includes a first current electrode coupled to the first voltage reference, a second current electrode coupled to a current electrode of the floating body cell, and a control electrode coupled to the control electrode of the first transistor. The third transistor includes a first current electrode coupled to the first voltage reference, a second current electrode coupled to the bit output, and a control electrode coupled to the current electrode of the floating body cell. The fourth transistor includes a first current electrode coupled to the bit output, a second current electrode coupled to a second voltage reference, and a control electrode. The fifth transistor includes a first current electrode, a second current electrode coupled to the second voltage reference, and a control electrode coupled to the first current electrode and coupled to the control electrode of the fourth transistor. The sixth transistor includes a first current electrode coupled to the first voltage reference, a second current electrode coupled to the first current electrode of the fifth transistor, and a control electrode coupled to the output of the reference source.

In accordance with another aspect of the present disclosure, a method is provided. The method includes providing a memory device including a memory array and a sense amplifier device. The memory array includes a floating body cell configured to store a bit value. The sense amplifier device includes a bit output configured to provide an output voltage representative of the bit value of the first floating body cell, a reference source configured to provide a reference voltage, a current mirror configured to provide a current to the floating body cell based on the reference voltage, and a differential amplifier circuit configured to determine the output voltage based on the reference voltage and a voltage across the floating body cell resulting from application of the current to the floating body cell. The method further includes sensing the bit value of the floating body cell using the sense amplifier device.

FIG. 1 illustrates an example floating body cell (FBC)-based memory device 100 in accordance with at least one embodiment of the present disclosure. The memory device 100 can be utilized in any of a variety of devices, such as, for example, a processor, a microcontroller, and the like. The memory device 100 can include, for example, the cache or on-chip memory of a processor, the system memory used in an information handing device, and the like.

In the depicted example, the memory device 100 comprises a FBC memory array 102, a row/column driver 104, and a sense amplifier device 108. The FBC memory array 102 comprises an array of floating body cells arranged in an array of rows and columns. Each floating body cell comprises one or more transistors implemented on a silicon on insulator (SOI) substrate, whereby each transistor of the floating body cell is used to store a data bit value or its complement (such as, for example, in a twin-cell implementation). A particular row/column can be accessed for reads and writes via the row/column driver 104 based on address (ADDR) data and control (CTL) data provided from, for example, a memory management unit of a processor.

The sense amplifier device 108 senses the bit value stored at one or more of the floating body cells and provides the one or more sensed bit values as a data out value 110. As discussed in greater detail with reference to FIGS. 2-5, the sense amplifier device 108, in one embodiment, utilizes a current-mirror loaded differential amplifier to generate a readable signal from the charge stored at an accessed floating body cell. The current mirror load of the differential amplifier can be biased in any of a variety of manners, such as by a reference voltage or current, one or more reference floating body cells, the complement floating body cell (also referred to as the "twin" cell), and the like. The biasing reference also can be used as an input to a second stage of amplification, which also may be a current-mirror loaded differential amplifier. The input to the second stage of amplification is used to set the bias for the second stage. By loading the first stage reference current source with the floating body cell being read, a voltage is generated across the floating body cell. The impedance of the floating body cell is generally proportional to the charge of the floating body cell, and thus is generally proportional to the bit value being "stored" by the floating body cell. Accordingly, the voltage across the floating body cell can be used as an input to the second stage, which compares it to the biasing reference voltage of the first stage amplifier. Based on the comparison, the second stage generates a signal representative of the stored bit value and which can be used in the digital components that receive the output of the sense amplifier device.

Figure 2:
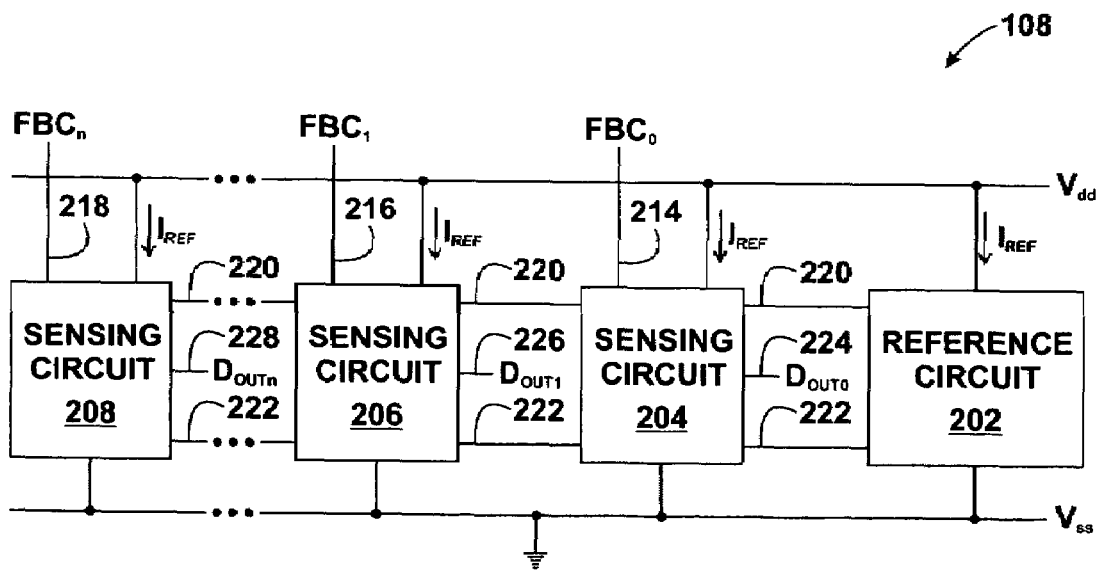
FIG. 2 is a diagram illustrating an example sense amplifier device of the FBC memory device of FIG. 1 in accordance with at least one embodiment of the present disclosure.

FIG. 2 illustrates an example implementation of the sense amplifier device 108 of FIG. 1 in accordance with at least one embodiment of the present disclosure. As illustrated, the sense amplifier device 108 can include a reference circuit 202 and one or more sensing circuits (e.g., sensing circuits 204, 206, and 208). Each of the sensing circuits 204, 206, and 208 is coupleable to a corresponding set of one or more columns of the FBC memory array 102 (via, e.g., a multiplexer), whereby an input 214 of the sensing circuit 204 is connected to a current electrode (e.g., the drain electrode) of a corresponding floating body cell $FBC_0$ of a first column, an input 216 of the sensing circuit 206 is connected to a current electrode of a corresponding floating body cell $FBC_1$ of a second column, an input 218 of the sensing circuit 208 is connected to a current electrode of a corresponding floating body cell $FBC_n$ of an nth column, and so forth. Further, each sensing circuit includes a bit output to provide an output voltage representative of the bit value stored by the corresponding floating body cell, whereby the sensing circuit 204 includes a bit output 224 for the bit value of the floating body cell $FBC_0$, the sensing circuit 206 includes a bit output 226 for the bit value of the floating body cell $FBC_1$, and whereby the sensing circuit 208 includes a bit output 228 for the bit value of the floating body cell $FBC_n$.

The reference circuit 202, in one embodiment, includes a reference source to provide a reference voltage, which in turn is used to bias a first stage current mirror and is also used as an input to a current-mirror loaded differential amplifier. The bias portion of the first stage current mirror and a portion of the current-mirror loaded differential amplifier are implemented at the reference circuit 202. The load portion of the first stage current mirror and the remaining portion of the differential amplifier are duplicated at each of the sensing circuits 204, 206, and 208. Accordingly, the bias portion of the first stage current mirror of the reference circuit 202 is connected to the corresponding load portion of the first stage current mirror of each of the sensing circuits 204, 206, and 208 via a bias output 220 and the biasing portion of the differential amplifier of the reference circuit 202 is connected to the corresponding differential amplifier portions of each of the sensing circuits 202, 204, and 206 via a biasing output 222.

Although FIG. 2 illustrates an embodiment wherein a single reference circuit 202 is used to provide the bias voltages for multiple sensing circuits, in other embodiments multiple reference circuits may be implemented in parallel to increase the performance and efficiency of the sense amplifier device 108. Further, any of a variety of ratios of reference circuits to sensing circuits may be utilized as appropriate.

Figure 3:
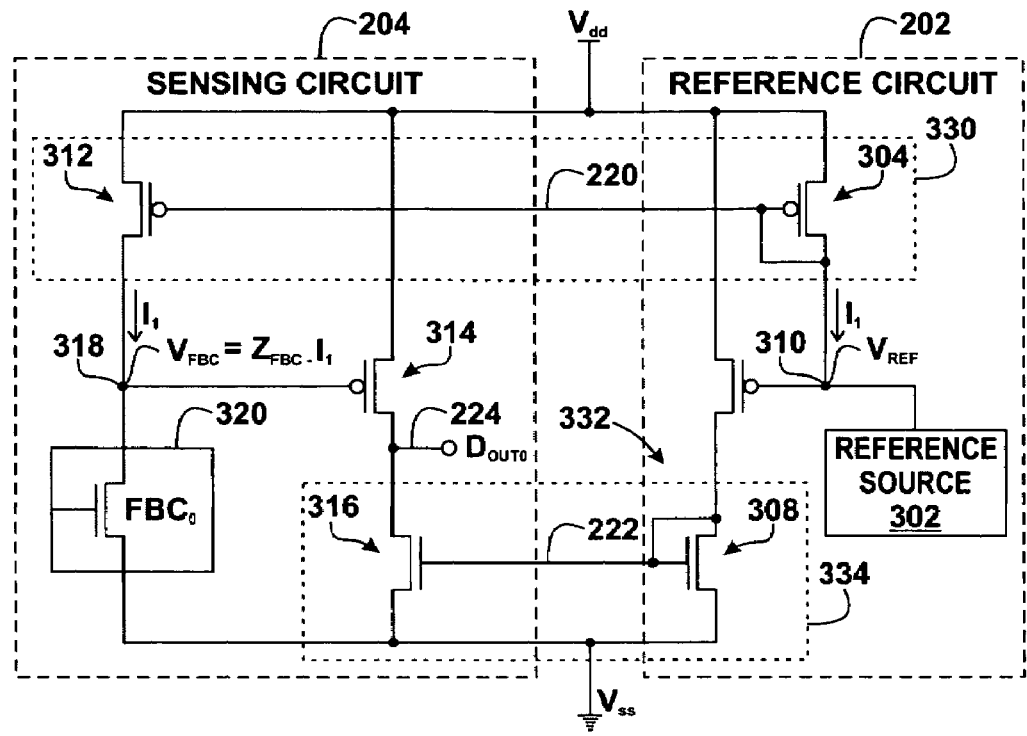
FIG. 3 is a circuit diagram illustrating an example implementation of the sense amplifier device of FIG. 2 in accordance with at least one embodiment of the present disclosure.

FIG. 3 illustrates an exemplary implementation of the reference circuit 202 in combination with the sensing circuit 204 in accordance with at least one embodiment of the present disclosure. The illustrated implementation may be expanded to include additional sensing circuits or reference circuits without departing from the scope of the present disclosure.

In the depicted example, the sensing circuit 202 includes a reference source 302 and transistors 304, 306, and 308. The reference source 302 includes an output to provide a reference voltage $V_{REF}$ to a node 310. The transistor 304 is a diode-connected transistor including a first current electrode connected to a first voltage reference (e.g., Vdd), a second current electrode connected to the node 310, and a control electrode connected to the node 310. The transistor 306 includes a first current electrode connected to the first voltage reference, a second current electrode, and a control electrode connected to the node 310. The transistor 308 is a diode-connected transistor including a first current electrode connected to the second current electrode of the transistor 306, a second current electrode connected to a second voltage reference (e.g., Vss), and a control electrode connected to the first current electrode.

As also depicted, the sensing circuit 204 includes transistors 312, 314, and 316. The transistor 312 includes a first current electrode connected to the first voltage reference, a second current electrode connected to a node 318, and a control electrode connected to the control electrode of the transistor 304 via the bias output 220. The node 318 is connected to the input 214 (FIG. 2) and thus is connected to the current electrode of the transistor of the floating body cell $FBC_0$ (identified in FIG. 3 as FBC 320) being sensed. The transistor 314 includes a first current electrode connected to the first voltage reference, a second current electrode connected to the bit output 224, and a control electrode connected to the node 318. The transistor 316 includes a first current electrode connected to the bit output 224, a second current electrode connected to the second voltage reference, and a control electrode connected to the control electrode of the transistor 308 via the bias output 224.

In one embodiment, the transistors 304 and 312 together form a first stage current mirror 330 such that the biasing portion (e.g., the transistor 304) is associated with the reference circuit 202 and the load portion (e.g., the transistor 312) can be duplicated at each sensing circuit. The transistors 306, 308, 314, and 316 together form a differential amplifier circuit 332. Further, in one embodiment, the differential amplifier circuit 332 is a current mirror loaded differential amplifier whereby the transistor 308 and the transistor 316 together form a second stage current mirror 334. Accordingly, a portion of the differential amplifier circuit 332, including the biasing portion of the second stage current mirror 334 (e.g., the transistor 308) can be associated with the reference circuit 202 and the remaining portion, including the load portion of the second stage current mirror 334 (e.g., the transistor 316) can be duplicated for each sensing circuit.

In the example of FIG. 2, the first voltage reference has a greater voltage potential than the second voltage reference (e.g., Vdd>Vss) and the transistors 304, 306, 312, and 314 are illustrated as p-channel transistors (e.g., p-channel field effect transistors (pFETs)) and the transistors 308 and 316 are illustrated as n-channel transistors (e.g., n-channel FETs or nFETS). However, in other implementations, the first voltage reference can have a lower voltage potential than the second voltage reference, and thus the transistors 304, 306, 312, and 314 can be implemented as n-channel transistors and the transistors 308 and 316 can be implemented as p-channel transistors with the appropriate modifications without departing from the scope of the present disclosure. Further, transistor technologies other than FETs, such as bipolar junction transistors (BJTs), may be implemented in accordance with the teachings herein.

In operation, the first stage current mirror 330 is biased by the reference voltage $V_{REF}$ such that a current $I_1$ is provided through the transistor 304. Consequently a current substantially equivalent to the current $I_1$ (and thus also referred to as current $I_1$ for ease of discussion) is mirrored at the transistor 312. The reference voltage $V_{REF}$ also is provided to one of the differential inputs of the differential amplifier circuit 332 at the control electrode of the transistor 306. By loading the first stage current mirror 330 with the FBC 320, a voltage $V_{FBC}$ is generated across the FBC 320 (e.g., between node 318 and Vss) as a result of the application of the current $I_1$ to the transistor of the FBC 320, whereby the voltage $V_{FBC}$ is based on the current $I_1$ and the impedance $Z_{FBC}$ of the FBC 320 (i.e., $V_{FBC}=I_1*Z_{FBC}$). Thus, because the impedance $Z_{FBC}$ is based on the amount of charge stored at the FBC 320 and thus is based on the bit value stored at the FBC 320 (e.g., in most instances, $Z_{FBC}$ is relatively high when the stored bit is a "0" and relatively low when the stored bit is a "1"), the voltage $V_{FBC}$ is based on the bit value stored at the FBC 320. Accordingly, the differential amplifier 332 compares the reference voltage $V_{REF}$ received at node 310 with the voltage $V_{FBC}$ received at node 318 and pulls the bit output 224 either to near Vdd (via the transistor 314) or to near Vss (via the transistor Vss) based on whether voltage $V_{FBC}$ is greater than or less than the reference voltage $V_{REF}$. Accordingly, when the bit output 224 is at or near Vdd, the FBC 320 can be interpreted to be storing a "1" and when the bit output 224 is at or near Vss, the FBC 320 can be interpreted to be storing a "0," or vice versa depending on implementation.

Figure 4:
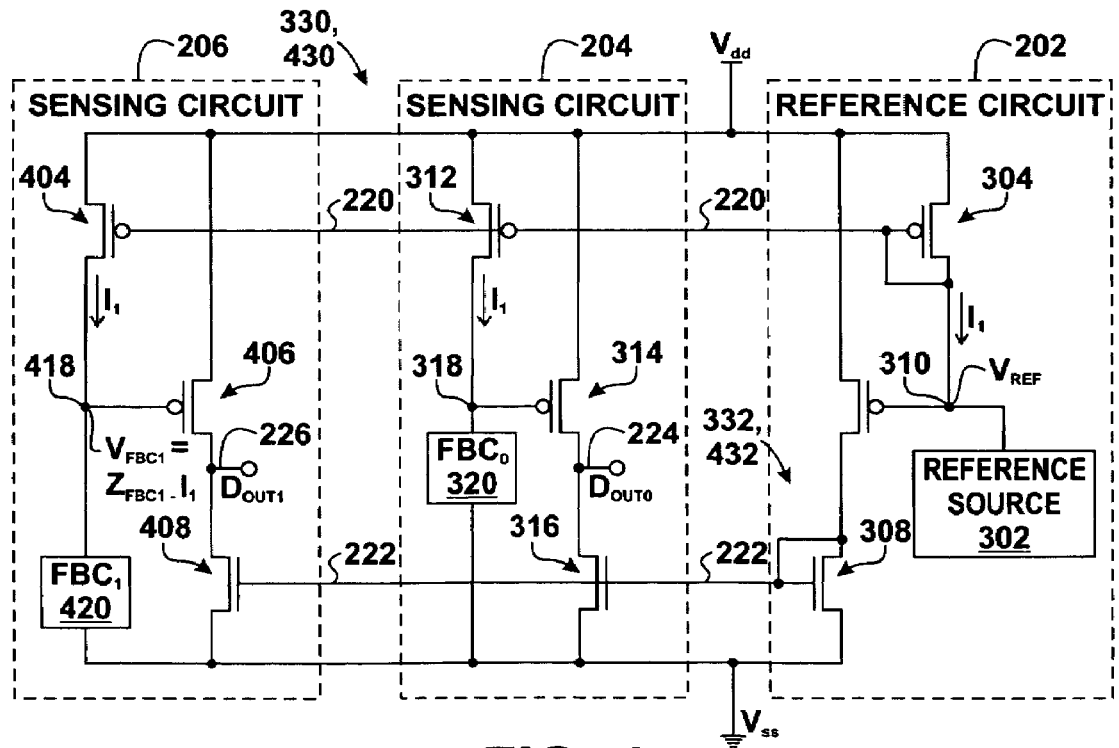
FIG. 4 is a circuit diagram illustrating another example implementation of the sense amplifier device of FIG. 2 in accordance with at least one embodiment of the present disclosure.

FIG. 4 illustrates an extension of the circuit of FIG. 2 to include multiple sensing circuits in accordance with at least one embodiment of the present disclosure. The depicted example illustrates the reference circuit 202 and the sensing circuits 204 and 206. The reference circuit 202 and the sensing circuit 204 are implemented as described with reference to FIG. 3, including the reference source 302 and the transistors 304, 306, 308, 312, 314, and 316. Similar to the sensing circuit 204, the sensing circuit 206 includes transistors 404, 406, and 408. The transistor 404 includes a first current electrode connected to the first voltage reference, a second current electrode connected to a node 418, and a control electrode connected to the control electrode of the transistor 304 via the bias output 220. The node 418 is connected to a current electrode of a transistor of the floating body cell FBC$_1$ (also referred to as FBC 420). The transistor 406 includes a first current electrode connected to the first voltage reference, a second current electrode connected to the bit output 226, and a control electrode connected to the node 418.

As the combination of the reference circuit 202 and the sensing circuit 204 provides the first stage current mirror 330 and the current-mirror loaded differential amplifier circuit 332, the combination of the reference circuit 202 and the sensing circuit 206 likewise creates a first stage current mirror 430 and a current-mirror loaded differential amplifier circuit 432 which operate in the same manner with respect to the FBC 420 so as to generate a voltage $V_{FBC}$ at the node 418 resulting from the application of the mirrored current $I_1$ to the FBC 420. Thus, for each additional sensing circuit, only a portion of a first stage current mirror and a portion of a differential amplifier circuit need be duplicated as each sensing circuit can share the corresponding current mirror and differential amplifier portions provided by the reference circuit 202 (or a combination of reference circuits 202 in parallel).

Figure 5:
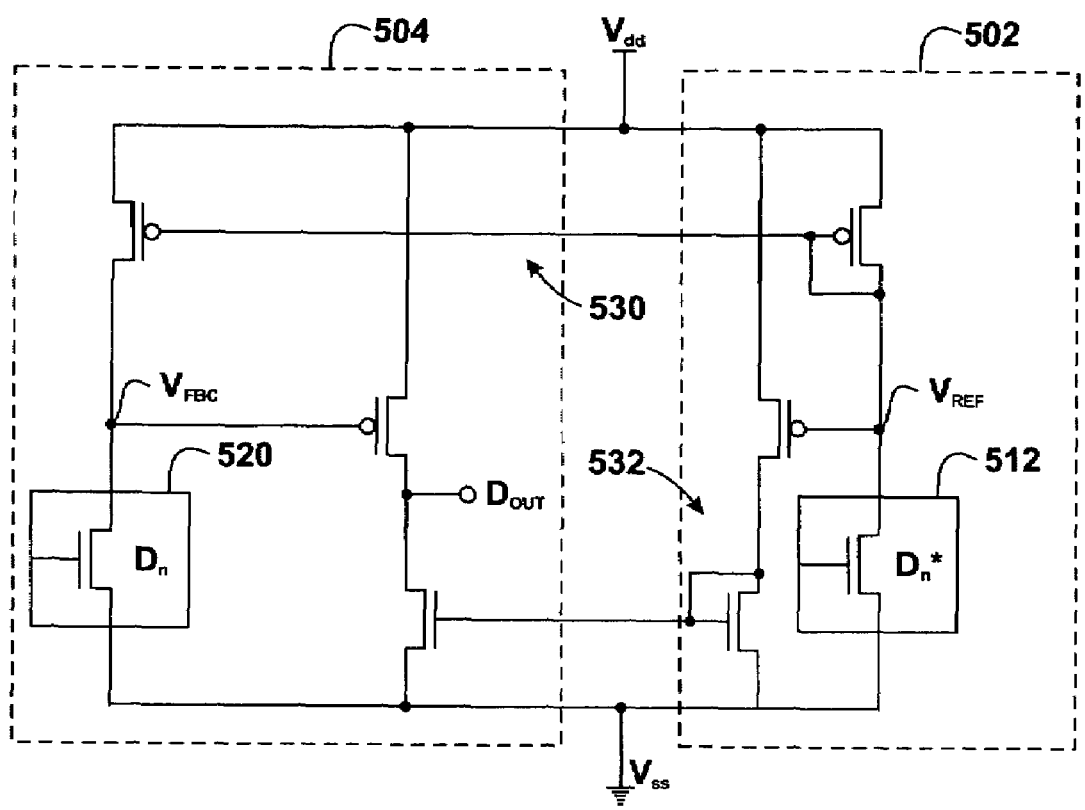
FIG. 5 is a circuit diagram illustrating an example implementation of the sense amplifier device of FIG. 2 using a twin cell configuration in accordance with at least one embodiment of the present disclosure.

FIG. 5 illustrates an exemplary implementation of the sense amplifier device 108 in a twin cell FBC memory configuration in accordance with at least one embodiment of the present disclosure. In certain instances, the FBC memory array 102 (FIG. 1) may be implemented as a "twin" cell architecture whereby each bit location is represented by a pair of floating body cells, one to store the bit value $D_n$ and the other to store the complement value $D_n^*$. Thus, as one floating body cell will have a relatively high impedance and the other will have a relatively low impedance, the complement floating body cell can be used to generate the reference voltage $V_{REF}$ for sensing the stored bit value of data floating body cell, or vice versa.

To illustrate, the sense amplifier circuit 108 can include a reference circuit 502 (analogous to the reference circuit 202, FIG. 2) and a sensing circuit 504 (analogous to the sensing circuit 204, FIG. 4), whereby a floating body cell (FBC) 520 is used to load a first stage current mirror 530 (analogous to the first stage current mirror 330, FIG. 3) formed by the reference circuit 502 and 504 and the corresponding complement floating body cell (FBC) 512 is used to bias the first state current mirror 530 by generating the voltage $V_{REF}$ as a result of the application of the mirrored current $I_1$ to the current electrode of the transistor of the FBC 512. Thus, because the impedances of the FBCs 512 and 520 are substantially different, the application of substantially equal currents to each via the first state current mirror results in substantially different voltages across the FBCs 512 and 520, which a differential amplifier circuit 532 (analogous to the differential amplifier circuit 332, FIG. 3) formed by the reference circuit 502 and the sensing circuit 504 can readily identify and provide a select one of a "0" bit value or a "1" bit value accordingly.

Although FIG. 5 illustrates a particular implementation of the reference source 302 of FIG. 3, other reference sources may be used without departing from the scope of the present disclosure. To illustrate, in one embodiment, a floating body cell configured to store a "0" bit value and a floating body cell configured to store a "1" bit value can be shorted together such that the voltage reference $V_{REF}$ generated across the complementary floating body cells as a result of the application of a mirrored current would be between the voltage that would result from applying the mirrored current to only the floating body cell that is programmed to store a "1" and the voltage that would result from applying the mirrored current to only the floating body cell that is programmed to store a "0"; in effect, a current equal to $(I_0+I_1)$ is applied to the FBC using the first stage current mirror. Other implementations of the reference source 302 can include, for example, a fixed voltage source, a fixed current source, and the like.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A memory device comprising:
  a memory array comprising a first floating body cell configured to store a first bit value and a second floating body cell configured to store a second bit value; and
  a sense amplifier device comprising:
    a first bit output configured to provide a first output voltage representative of the first bit value;
    a reference source configured to provide a reference voltage;
    a first current mirror configured to provide a first current to the first floating body cell based on the reference voltage;
    a first differential amplifier circuit configured to determine the first output voltage based on the reference voltage and a voltage across the first floating body cell resulting from application of the first current to the first floating body cell;
    a second bit output configured to provide a second output voltage representative of the second bit value;
    a second current mirror configured to provide a second current to the second floating body cell based on the reference voltage, wherein the second current is substantially equal to the first current;
    a second differential amplifier circuit configured to determine the second output voltage based on the reference voltage and a voltage across the second floating body cell resulting from application of the second current to the second floating body cell; and
    the reference source comprising a third floating body cell and a fourth floating body cell coupled in parallel, wherein the third floating body cell is configured to store a third bit value and the fourth floating body cell is configured to store a fourth bit value that is a complement of the third bit value.

2. The memory device of claim 1, wherein the first current mirror is configured to provide a third current to the third floating body cell and the fourth floating body cell, wherein the first current is substantially equal to the third current.

3. The memory device of claim 1, wherein the first current mirror comprises:
  a first transistor comprising a first current electrode coupled to a first voltage reference, a second current electrode coupled to an output of the reference source, and a control electrode coupled to the second current electrode; and
  a second transistor comprising a first current electrode coupled to the first voltage reference, a second current electrode coupled to a current electrode of the first floating body cell, and a control electrode coupled to the control electrode of the first transistor.

4. The memory device of claim 3, wherein the first differential amplifier comprises:
  a third transistor comprising a first current electrode coupled to the first voltage reference, a second current electrode coupled to the first bit output, and a control electrode coupled to the current electrode of the first floating body cell;
  a fourth transistor comprising a first current electrode coupled to the first bit output, a second current electrode coupled to a second voltage reference, and a control electrode;
  a fifth transistor comprising a first current electrode, a second current electrode coupled to the second voltage reference, and a control electrode coupled to the first current electrode and coupled to the control electrode of the fourth transistor; and
  a sixth transistor comprising a first current electrode coupled to the first voltage reference, a second current electrode coupled to the first current electrode of the fifth transistor, and a control electrode coupled to the output of the reference source.

5. The memory device of claim 4, wherein:
  the first voltage reference has a higher voltage potential than the second voltage reference;
  the first transistor, the second transistor, the third transistor, and the sixth transistor comprise p-channel transistors; and
  the fourth transistor and the fifth transistor comprise n-channel transistors.

6. The memory device of claim 4, wherein:
  the first voltage reference has a lower voltage potential than the second voltage reference;

the first transistor, the second transistor, the third transistor, and the sixth transistor comprise n-channel transistors; and the fourth transistor and the fifth transistor comprise p-channel transistors.

7. The memory device of claim 1, wherein the first differential amplifier circuit comprises:
a third current mirror having a first current electrode and a second current electrode;
a first transistor comprising a first current electrode coupled to a first voltage reference, a second current electrode coupled to the first bit output and coupled to the first current electrode of the third current mirror, and a control electrode coupled to a current electrode of the first floating body cell; and
a second transistor comprising a first current electrode coupled to the first voltage reference, a second current electrode coupled to the second current electrode of the third current mirror, and a control electrode coupled to an output of the reference source.

8. The memory device of claim 7, wherein the third current mirror comprises:
a third transistor comprising a first current electrode coupled to the second current electrode of the first transistor, a second current electrode coupled to a second voltage reference, and a control electrode; and
a fourth transistor comprising a first current electrode coupled to the second current electrode of the second transistor, a second current electrode coupled to the second voltage reference, and a control electrode coupled to the first current electrode and coupled to the control electrode of the third transistor.

9. The memory device of claim 1, wherein:
the first current mirror comprises:
a first transistor comprising a first current electrode coupled to a first voltage reference, a second current electrode coupled to an output of the reference source, and a control electrode coupled to the second current electrode; and
a second transistor comprising a first current electrode coupled to the first voltage reference, a second current electrode coupled to a current electrode of the first floating body cell, and a control electrode coupled to the control electrode of the first transistor; and
the second current mirror comprises:
the first transistor; and
a third transistor comprising a first current electrode coupled to the first voltage reference, a second current electrode coupled to a current electrode of the second floating body cell, and a control electrode coupled to the control electrode of the first transistor.

10. The memory device of claim 9, wherein:
the first differential amplifier comprises:
a fourth transistor comprising a first current electrode coupled to the first voltage reference, a second current electrode coupled to the first bit output, and a control electrode coupled to the current electrode of the first floating body cell;
a fifth transistor comprising a first current electrode coupled to the first bit output, a second current electrode coupled to a second voltage reference, and a control electrode;
a sixth transistor comprising a first current electrode, a second current electrode coupled to the second voltage reference, and a control electrode coupled to the first current electrode and coupled to the control electrode of the fifth transistor; and
a seventh transistor comprising a first current electrode coupled to the first voltage reference, a second current electrode coupled to the first current electrode of the sixth transistor, and a control electrode coupled to the output of the reference source; and
the second differential amplifier comprises:
the sixth transistor;
the seventh transistor;
an eighth transistor comprising a first current electrode coupled to the first voltage reference, a second current electrode coupled to the second bit output, and a control electrode coupled to the current electrode of the second floating body cell; and
a ninth transistor comprising a first current electrode coupled to the second bit output, a second current electrode coupled to a second voltage reference, and a control electrode coupled to the control electrode of the sixth transistor.

11. A sense amplifier device comprising:
a first input coupleable to a first floating body cell of a memory array, the first floating body cell configured to store a first bit value;
a first bit output to provide a first output voltage representative of the first bit value;
a reference source configured to provide a reference voltage, the reference source comprising a second floating body cell and a third floating body cell coupled in parallel, wherein the second floating body cell is configured to store a second bit value and the third floating body cell is configured to store a third bit value that is a complement of the second bit value;
a first transistor comprising a first current electrode coupled to a first voltage reference, a second current electrode configured to receive the reference voltage, and a control electrode coupled to the second current electrode;
a second transistor comprising a first current electrode coupled to the first voltage reference, a second current electrode coupled to a current electrode of the first floating body cell, and a control electrode coupled to the control electrode of the first transistor;
a third transistor comprising a first current electrode coupled to the first voltage reference, a second current electrode coupled to the first bit output, and a control electrode coupled to the current electrode of the first floating body cell;
a fourth transistor comprising a first current electrode coupled to the first bit output, a second current electrode coupled to a second voltage reference, and a control electrode;
a fifth transistor comprising a first current electrode, a second current electrode coupled to the second voltage reference, and a control electrode coupled to the first current electrode and coupled to the control electrode of the fourth transistor; and
a sixth transistor comprising a first current electrode coupled to the first voltage reference, a second current electrode coupled to the first current electrode of the fifth transistor, and a control electrode coupled to the output of the reference source.

12. The sense amplifier device of claim 11, wherein:
the first voltage reference has a higher voltage potential than the second voltage reference;
the first transistor, the second transistor, the third transistor, and the sixth transistor comprise p-channel transistors; and the fourth transistor and the fifth transistor comprise n-channel transistors.

13. The sense amplifier device of claim 11, wherein:
the first voltage reference has a lower voltage potential than the second voltage reference;
the first transistor, the second transistor, the third transistor, and the sixth transistor comprise n-channel transistors; and
the fourth transistor and the fifth transistor comprise p-channel transistors.

14. The sense amplifier device of claim 11, further comprising:
a second input coupleable to a second floating body cell of the memory array, the second floating body cell configured to store a second bit value;
a second bit output to provide a second output voltage representative of the second bit value;
a seventh transistor comprising a first current electrode coupled to the first voltage reference, a second current electrode coupled to a current electrode of the second floating body cell, and a control electrode coupled to the control electrode of the first transistor;
an eighth transistor comprising a first current electrode coupled to the first voltage reference, a second current electrode coupled to the second bit output, and a control electrode coupled to the current electrode of the second floating body cell; and
a ninth transistor comprising a first current electrode coupled to the second bit output, a second current electrode coupled to the second voltage reference, and a control electrode coupled to the control electrode of the fifth transistor.

15. A method comprising:
providing a memory device comprising a memory array and a sense amplifier device, the memory array comprising a first floating body cell configured to store a first bit value and a second floating body cell configured to store a second bit value, and the sense amplifier device comprising a first bit output configured to provide a first output voltage representative of the first bit value of the first floating body cell, a second bit output configured to provide a second output voltage representative of the second bit value of the second floating body cell, a reference source configured to provide a reference voltage, a first current mirror configured to provide a first current to the first floating body cell based on the reference voltage, a second current mirror configured to provide a second current to the second floating body cell based on the reference voltage, the second current equal to the first current, a first differential amplifier circuit configured to determine the first output voltage based on the reference voltage and a voltage across the first floating body cell resulting from application of the first current to the first floating body cell, and a second differential amplifier circuit configured to determine the second output voltage based on the reference voltage and a voltage across the second floating body cell resulting from application of the second current to the second floating body cell, and the reference source comprising a third floating body cell and a fourth floating body cell coupled in parallel, wherein the third floating body cell is configured to store a third bit value and the fourth floating body cell is configured to store a fourth bit value that is a complement of the third bit value;
sensing the first bit value of the first floating body cell using the sense amplifier device; and
sensing the second bit value of the second floating body cell using the sense amplifier device.

16. The method of claim 15, wherein sensing the first bit value of the first floating body cell comprises:
generating a voltage across the first floating body cell by applying the first current to the first floating body cell; and
comparing the voltage across the first floating body cell with the reference voltage using the first differential amplifier circuit to generate the first output voltage.

* * * * *